United States Patent
Kotanagi

(10) Patent No.: US 6,560,167 B1
(45) Date of Patent: May 6, 2003

(54) THERMOELECTRIC GENERATION UNIT AND PORTABLE ELECTRONIC DEVICE USING THE UNIT

(75) Inventor: Susumu Kotanagi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/582,023

(22) PCT Filed: Dec. 24, 1998

(86) PCT No.: PCT/JP98/05937

§ 371 (c)(1),
(2), (4) Date: Aug. 29, 2000

(87) PCT Pub. No.: WO99/34452

PCT Pub. Date: Jul. 8, 1999

(30) Foreign Application Priority Data

Dec. 25, 1997 (JP) .............................................. 9-358074
Feb. 24, 1998 (JP) ........................................... 10-042543

(51) Int. Cl.⁷ .............................. G04B 1/00; H01L 35/00
(52) U.S. Cl. ........................ 368/203; 368/204; 136/205
(58) Field of Search ......................... 368/88, 203, 204, 368/276, 286; 136/205, 230, 242

(56) References Cited

U.S. PATENT DOCUMENTS

| | | | | |
|---|---|---|---|---|
| 3,379,577 A | * | 4/1968 | Bird, Jr. ...................... | 136/205 |
| 4,106,279 A | * | 8/1978 | Martin et al. ................ | 368/204 |
| 4,213,292 A | * | 7/1980 | Dolezal et al. .............. | 368/204 |
| 5,517,468 A | * | 5/1996 | Inoue et al. ................. | 368/203 |
| 5,705,770 A | * | 1/1998 | Ogasawara et al. ......... | 136/205 |
| 5,889,735 A | * | 3/1999 | Kawata et al. .............. | 136/205 |
| 5,974,002 A | * | 10/1999 | Tsubata ....................... | 368/204 |
| 6,034,318 A | * | 3/2000 | Lycke et al. ................. | 136/205 |
| 6,075,757 A | * | 7/2000 | Kawata ....................... | 368/204 |
| 6,222,114 B1 | * | 4/2001 | Mitamura .................... | 136/242 |
| 6,259,656 B1 | * | 7/2001 | Kotanagi .................... | 368/204 |
| 6,291,760 B1 | * | 9/2001 | Mitamura .................... | 136/205 |
| 6,304,520 B1 | * | 10/2001 | Watanabe .................... | 368/203 |
| 6,304,521 B1 | * | 10/2001 | Kanesaka .................... | 368/204 |

OTHER PUBLICATIONS

Borshchevsky et al., Microfabricated thermoelectric power generator for use in electrical components, especially wristwatch uses a thermal gradient between hot and cool regions to generate electrical power, Derwent, Abstract, 1999.*

* cited by examiner

*Primary Examiner*—Vit Miska
*Assistant Examiner*—Jeanne-Marguerite Goodwin
(74) *Attorney, Agent, or Firm*—Adams & Wilks

(57) ABSTRACT

A thermoelectric power generator unit is provided with good heat conducting efficiency and increased resistance to damage of thermoelectric elements due to horizontal and vertical force applied to the thermoelectric elements. Protecting members such as a frame and support columns are disposed around thermoelectric elements between a heat absorbing member and a heat radiating member of the thermoelectric power generator unit. A buffer is provided between the thermoelectric elements and at least one of the heat absorbing member and the heat radiating member.

48 Claims, 15 Drawing Sheets ly, to a thermoelectric power generated
THERMOELECTRIC GENERATION UNIT AND PORTABLE ELECTRONIC DEVICE USING THE UNIT

TECHNICAL FIELD

The present invention relates to a thermoelectric power generator unit using thermoelectric elements and to a portable electronic appliance to be driven on the energy thereof and, more particulartimepiece.

BACKGROUND OF THE INVENTION

Conventionally, there has been disclosed a structure of a thermoelectric type wrist watch using, as an energy source replacing a battery, a thermoelectric element for causing an electromotive force based on a Seebeck effect.

FIG. 2 is a sectional view showing a structure of a conventional thermoelectric power generated timepiece having a thermoelectric element as an energy source.

The thermoelectric power generated timepiece is in a timepiece structure comprising a movement 201, a thermoelectric type generator 202, an electric energy capacitor (not shown), a metal bottom part 203, a frame part 204 formed of a thermally insulating substance, and a metal top part 205. A thermoelectric power generated timepiece as above is disclosed, for example, in Japanese Patent Publication No. 13279. However, practicing has not been made for a thermoelectric power generator unit having a sufficient power generation capability and taking into account size reduction and for a thermoelectric power generated timepiece using such a thermoelectric power generator unit. Also, there has been no disclosure of a concrete structure of such a thermoelectric power generator unit.

The thermoelectric element can produce an electromotive force by providing a temperature difference between a heat absorbing side as a first support member and a heat radiating side as a second support member. The electromotive force increases with increase of the temperature difference. In order to obtain a high electromotive force, there is a need to raise the efficiency of heat absorption from a heat source and the efficiency of heat radiation through the thermoelectric element. This requires an efficient heat conduction path to conduct the heat from the back lid to the thermoelectric element and radiate heat from the thermoelectric element to the case and from the case into ambient air.

However, the thermoelectric element is weak in strength for an external force. In particular, n-type semiconductors and p-type semiconductors are in an elongate columnar form, a plurality of which are arranged standing. Accordingly, if a lateral force or excessive vertical force is applied with respect to a direction of heat transfer through the n-type semiconductor and p-type semiconductor, there is a fear that the thermoelectric element be damaged. Meanwhile, it has been impossible to provide a contact force to the heat absorbing member and heat radiating member into contact with the thermoelectric element in order for increasing thermal conductive efficiency.

Therefore, it is an object of the present invention to prevent against damage to a thermoelectric element due to an external force and improve impact resistance, and also facilitate handling of the thermoelectric element during assembling and obtain a thermal conducting structure good in thermal conductive efficiency.

DISCLOSURE OF THE INVENTION

In order to solve the problem in the prior art that the thermoelectric element is weak in strength and the thermoelectric element is difficult to assemble and handle, the present invention is a unit structure wherein thermoelectric elements are arranged at inside by protecting means having a heat absorbing member and a heat radiating member and fixed on a member on a heat absorbing side or heat radiating side by attaching holding means to connect the thermoelectric elements in series by electrical connection means, preventing fracture of the thermoelectric element due to an external force and realizing a structure good in thermal conductivity. Also, the unit structure can minimize the area of the protecting member and hence effective for thermoelectric element protection and heat loss. The thermoelectric power generator unit is easy to exchange because of screw fixing.

Also, the structure of the thermoelectric power generator unit according to the present invention can be provided directly on the back lid.

BEST MODE FOR CARRING OUT THE INVENTION

Figure 1:
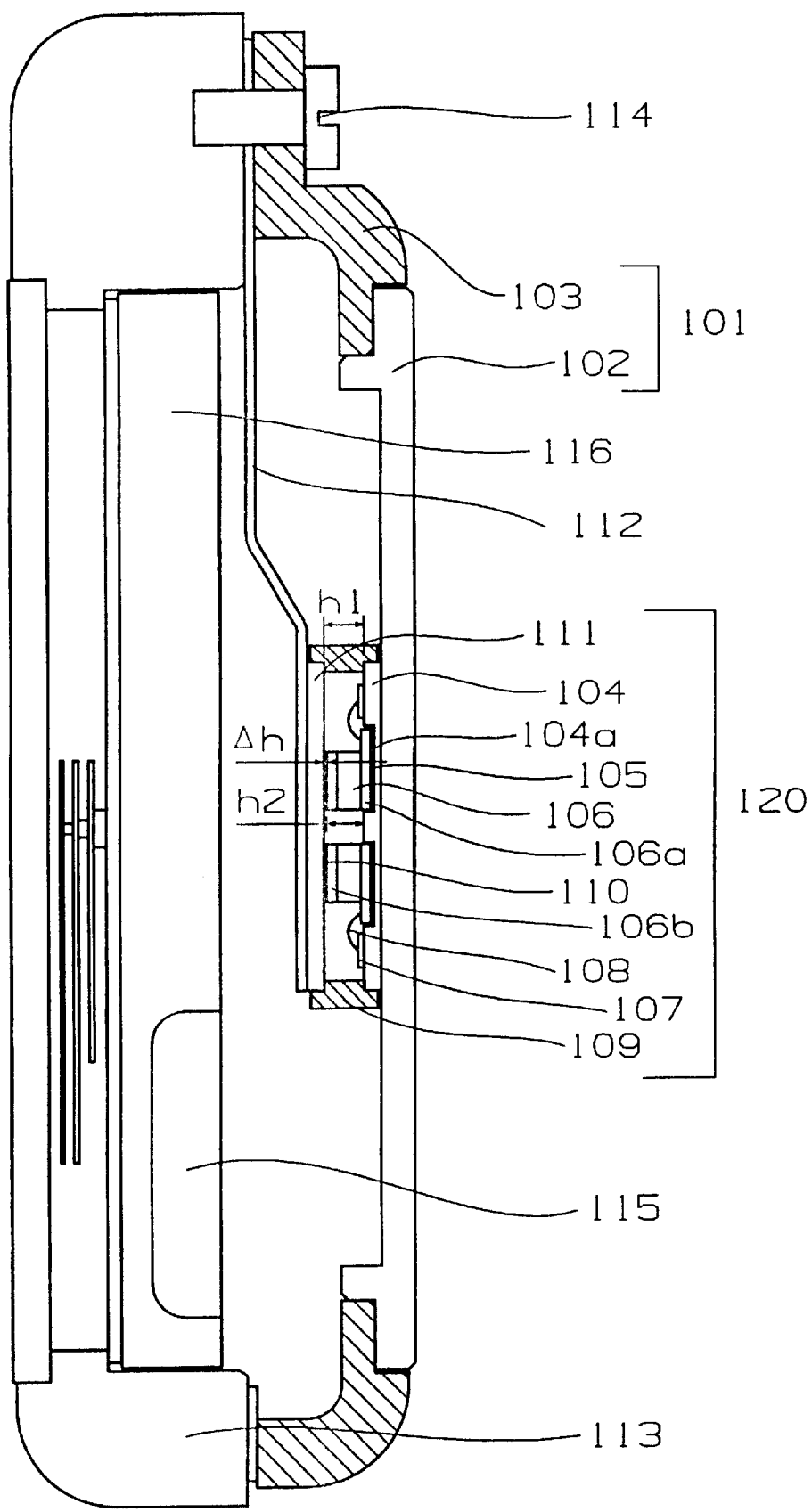
FIG. 1 is a sectional view of a thermoelectric power generator unit and thermoelectric power generated timepiece using the same unit according to a first embodiment of the present invention.
Figure 2:
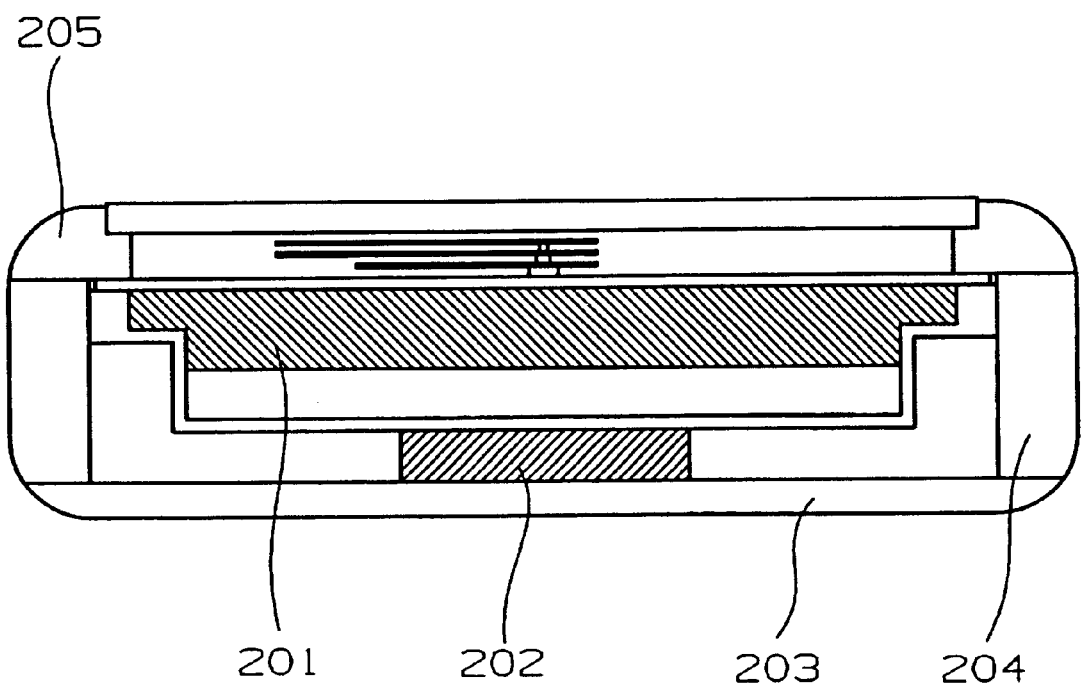
FIG. 2 is a sectional view of a structure of a conventional thermoelectric power generated timepiece.

In a thermoelectric power generator unit of the present invention, at least one or more thermoelectric elements are arranged on a heat absorbing member or on a heat radiating member and fixed on the heat absorbing member or the heat radiating member by holding means for attaching the thermoelectric elements, protecting means for the thermoelectric elements being provided and fixed between the heat absorbing member and the heat radiating member, and the thermoelectric elements being connected in series by electrical connection means.

The heat absorbing member or the heat radiating member is of a material high in thermal conductivity and uses, for example, copper or aluminum. Also, the heat absorbing member or the heat radiating member is provided with a groove for receiving part of the thermoelectric element, as positioning means in positioning the thermoelectric elements.

Also, the holding means of the thermoelectric element is an adhesive having a thermal conductivity and preferably uses an adhesive filled, for example, with silver powder, graphite or alumina.

The protecting means for the thermoelectric elements is formed of a material low in thermal conductivity and uses, for example, a synthetic resin material of ABS or polycarbonate. At around an arrangement of the thermoelectric elements, a frame, support columns or hollow pipes are provided. It can be considered to integrally form the frame and the support columns. Furthermore, the height of the frame or support column receiving the radiating plate is made higher by a forming tolerance of a part forming the unit than a top surface position of the thermoelectric element. A gap is provided between the heat absorbing member or heat radiating member and the thermoelectric element. A viscous member having thermal conductivity, e.g. silicone grease filled with silver powder or graphite or alumina, is filled in the gap between the thermoelectric elements and the heat absorbing member or heat radiating member thereby performing heat conduction and preventing the thermoelectric elements from directly applied with load.

Furthermore, the electrical connection means for the thermoelectric elements use a connection method with chip boards and wires. For the protecting means, a leadframe is insert-formed thereby facilitating wire connection.

The thermoelectric power generator unit constructed as above is fixed on a back lid or the heat radiating member through a screw as holding means or thermally conductive adhesive. The thermoelectric power generator unit on its heat radiation side and the heat conducting means are provided in contact. Also, in order to enhance heat conductive efficiency, the thermoelectric power generator unit at its heat radiating side and the heat conducting means are preferably contacted with pressurization. Furthermore, the heat conducting means and the barrel are held in contact.

According to the above structure, heat is absorbed through the back lid and conveyed through the thermoelectric power generator unit and heat conducting means to the barrel, thus providing a heat conducting path to radiate heat from the barrel to ambient air. A temperature difference is caused between a heat absorbing side and a heat radiating side of the thermoelectric power generator unit, performing power generation.

According to the thermoelectric power generator unit constructed as above and thermoelectric power generated timepiece using the same unit, a heat conducting plate can be contacted under pressurizing with the heat radiating side of the thermoelectric power generator unit without damaging the thermoelectric elements, hence improving heat conducting efficiency. Furthermore, because the position where the thermoelectric elements are arranged is collective, electrical connection between the thermoelectric elements and thermoelectric power generator unit are easy to handle.

Hereunder, an embodiment of the invention will be explained based on the drawings. It should be noted that the detailed embodiment concerns a thermoelectric generation timepiece.

FIG. 1 is a sectional view showing a first embodiment of a thermoelectric power generator unit and thermoelectric generation timepiece using the same unit. A thermoelectric generation unit 120 has thermoelectric elements 106 arranged and fixed on a heat absorbing plate 104. Electric connections are made by output terminals 306 of the thermoelectric elements 106, chip boards 107 and wires 108. The heat absorbing plate 104 is fixed on one side of a frame 109 as protection means for the thermoelectric elements, and a heat radiating plate 111 is fixed on the other side.

The heat absorbing plate 104 is of a material high in thermal conductivity, e.g. copper or aluminum. The thermal conductivity $\lambda$ (W/mK) is $\lambda=386$ for copper or $\lambda=228$ for aluminum. Grooves 104a are provided as positioning means for the thermoelectric elements 106.

The thermoelectric element 106 has a first support member 106a on a heat absorbing side which is fixed to the heat absorbing plate 104 through a thermally conductive adhesive 105 as holding means for the thermoelectric element 106, e.g. silver paste or epoxy resin filled by 10–40% with a carbon powder or graphite. Furthermore, as electric connection means for connecting the thermoelectric elements 106 in series, the chip boards 107 are fixed on the heat absorbing plate 104. Through wires 108 the thermoelectric elements 106 and the chip boards 107 are electrically connected.

With a low thermal conductive material, e.g. a resin material such as ABS or polycarbonate ($\lambda=0.1$–$0.2$), a frame 109 is provided as protection means for the thermoelectric elements 106.

The frame 109 is rested thereon with a heat radiating plate 111 formed of a high thermal conductive material for conducting heat on the thermoelectric elements 106, e.g. of copper or aluminum (copper: $\lambda=386$, aluminum: $\lambda=228$). However, the frame 109 structurally has its top surface position h1 higher by a part fabrication tolerance than a top surface position h2 of the thermoelectric element 106. Thus, a gap of $\Delta h$ is provided between the second support member 106b of the thermoelectric element 106 and the heat radiating plate 111.

The gap provided by the above structure is filled by a buffer member 110 having thermal conductivity, e.g. silicone grease filled by 10–40% with a silver powder or alumina. A heat radiating plate 111 is fixed through the frame 109 as a guide.

The thermoelectric generation unit 120 constructed as above is fixed by coupling means (not shown) such as screws to a back lid 101 integrally structured by fixation at respective connecting portions of between a metal-make back lid member 102 and a frame 103 formed of a heat insulating member, e.g. a resin material ABS or polycarbonate ($\lambda=0.1$–$0.2$). Furthermore, a heat conductive plate 112 is provided over the thermoelectric generation unit 120. Contact is made with the heat radiating plate 111 by an elastic force of the heat conducting plate 112, and the frame 103 is fixed by a back lid screw 114 thereby contacting and fixing the heat conducting plate 112 with and on a barrel 113. The barrel 113 is incorporated with a circuit for boosting an output from the thermoelectric power generator unit 120 and a movement 116 having a secondary battery 115 storing electric power therefor. Electrical connection is provided between an output pattern 107b of the thermoelectric power generator unit 120 and the booster circuit.

Figure 3:
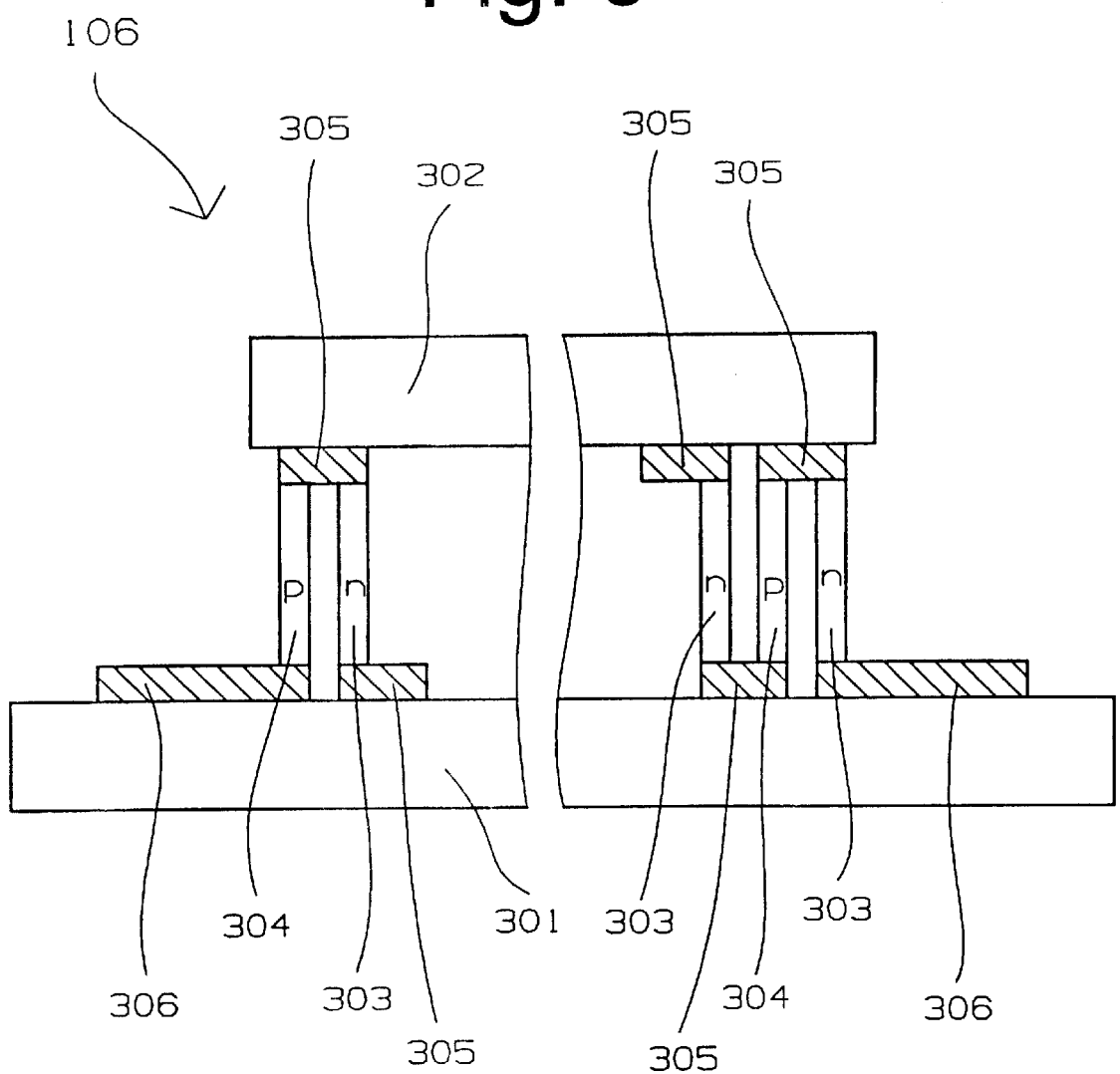
FIG. 3 is a sectional view of a structure of a thermoelectric element of the invention.

FIG. 3 is a sectional view in structure of the thermoelectric element 106 used in the invention. The first support member 301 and the second support member 302 serve to support contact portions of n-type semiconductor 303 and p-type semiconductor 304 of the thermoelectric element 106. Accordingly, they must be insulated at surfaces to be contacted with the connection portions. The first support member 301 is structured by aluminum put with a silicon or oxide film thus made as a heat absorbing side. The second support member 302 is structured by aluminum put with a silicon or oxide film thus made as a heat radiating side. In the case that a temperature difference is given such that the temperature on the heat absorbing side is higher than the heat radiating side, heat is transferred in a direction of from the first support member 301 to the second support member 302. Thereupon, in the n-type semiconductor 303, electrons move toward the second support member 302 on the heat radiating side. In the p-type semiconductor 304, holes move toward the second support member 302 on the heat radiating side. Because the n-type semiconductor 303 and the p-type semiconductor 304 are electrically connected in series through the connection portion 305, heat transfer is transformed into electric current thus providing an electromotive force on an output terminal 306.

Figure 4:
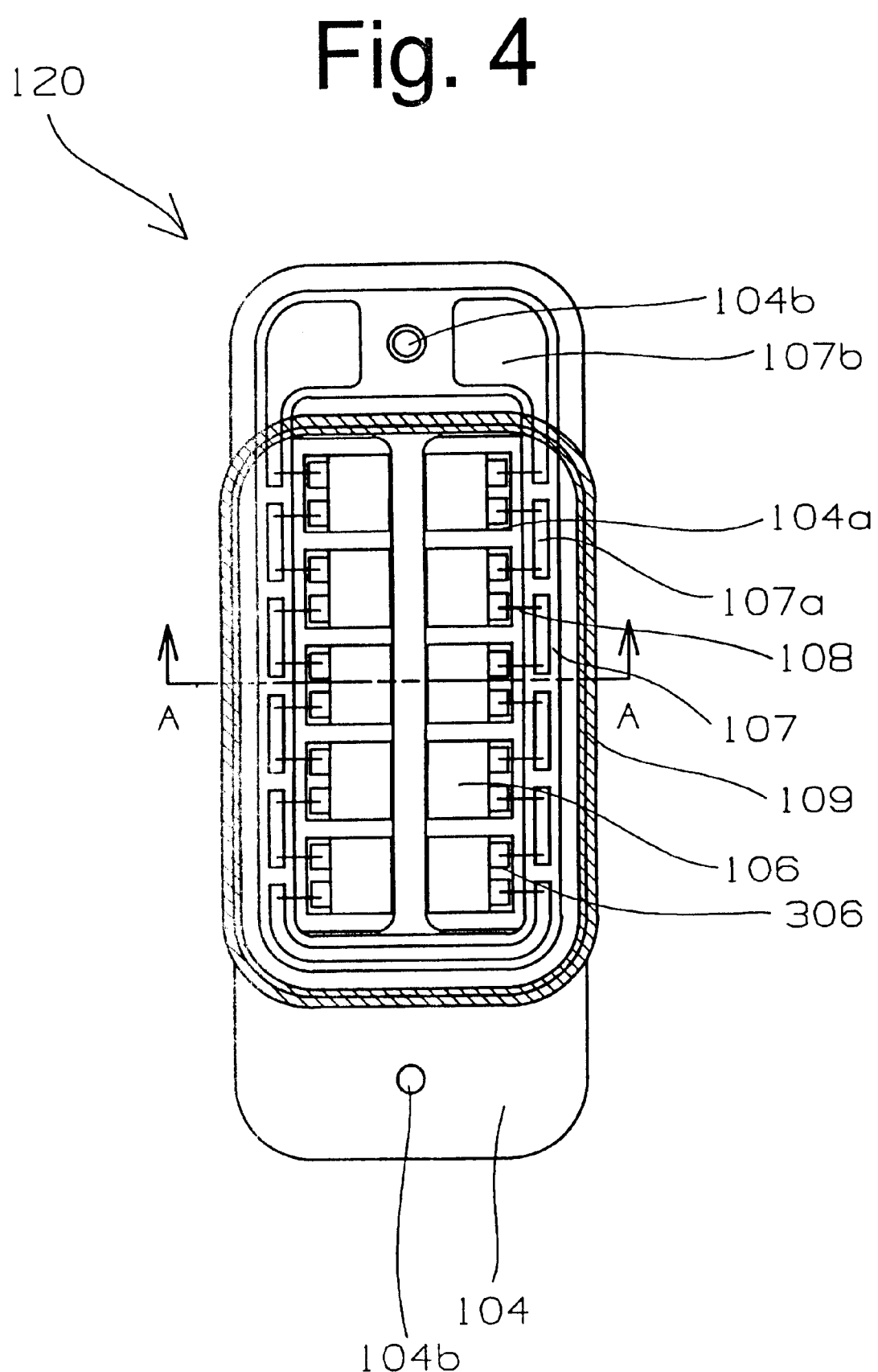
FIG. 4 is a plan view of a thermoelectric power generator unit of a first embodiment of the invention.

FIG. 4 is a plan view showing a thermoelectric generator unit 120 as first embodiment of the invention. The sectional view of the thermoelectric power generator unit 120 shown in FIG. 1 is given by the sectional view of FIG. 4 showing a cut part by the arrow A—A. Depending upon a required electromotive force, thermoelectric elements 106 are placed on the heat absorbing plate 104 and fixed through an adhesive (not shown) having thermal conductivity. A frame 109 is provided around the thermoelectric elements 106 arranged on the heat absorbing plate 104. The frame 109 is formed of a material low in thermal conductivity, e.g. a resin material of ABS or polycarbonate. Chip boards 107 are provided in order to connect the thermoelectric elements 106 in series. Connection is made through a wire 108 between an output terminal 306 of the thermoelectric element 106 and a connection pattern 107a on the chip board 107. Further, on the chip board 107 is provided an output pattern 107b to output a generation power to the outside. The heat absorbing plate 104 has a hole 104b for fixing the thermoelectric power generator unit 120 to a back lid 102 so that the thermoelectric power generator unit 120 can be joined to the back lid 102 through screws or the like.

Figure 5:
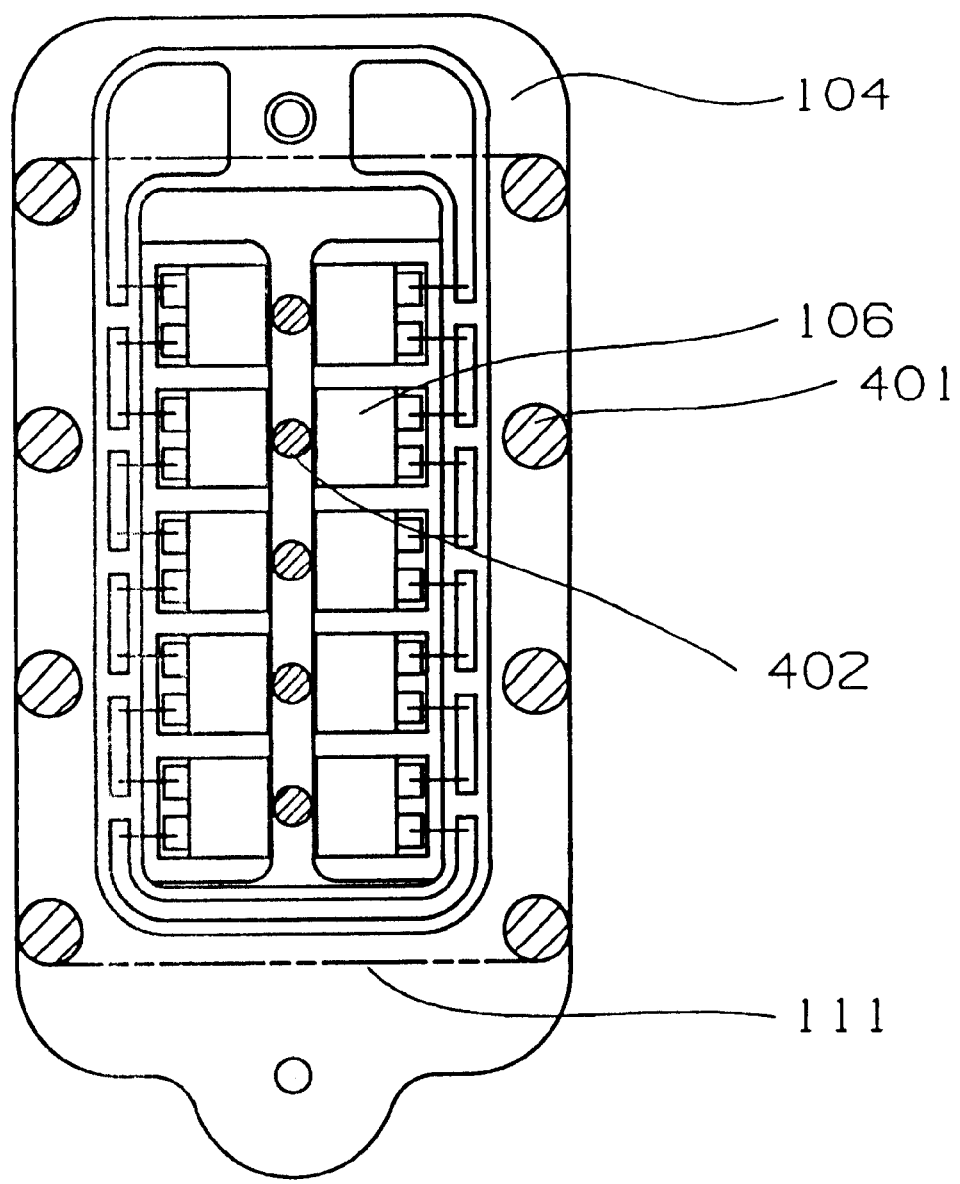
FIG. 5 is a plan view of a thermoelectric power generator unit of a second embodiment of the invention.
Figure 6:
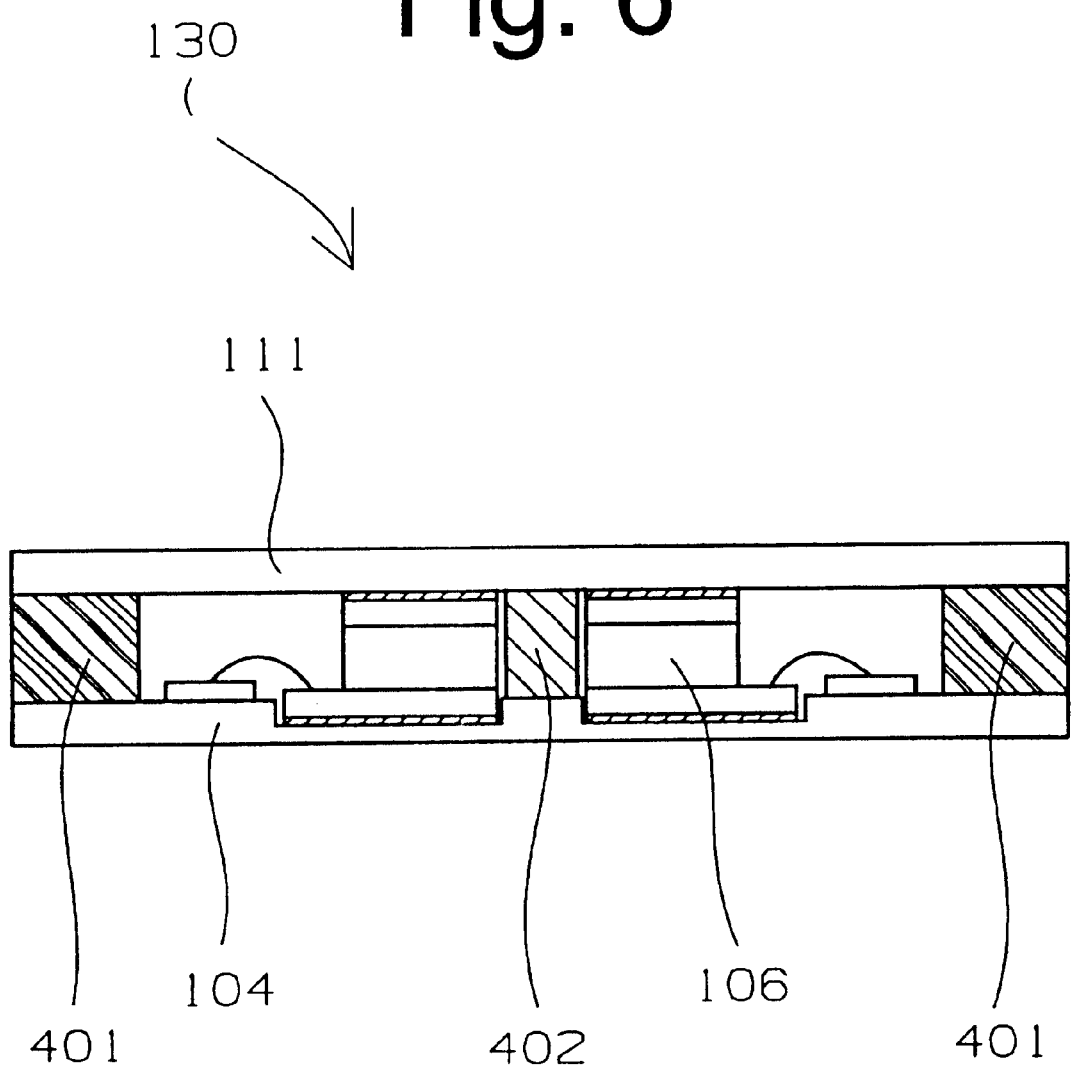
FIG. 6 is a plan view of the thermoelectric power generator unit of the second embodiment of the invention.

FIG. 5 is a plan view of a thermoelectric power generator unit 130 as a second embodiment of the invention, while FIG. 6 shows a sectional view thereof. On a heat absorbing plate 104, support columns 401, 402 are provided around the thermoelectric elements 106 and between the thermoelectric elements 106 thus providing a structure for protecting the thermoelectric elements 106. With this structure, it is possible to reduce the sectional area of the support column requiring heat insulation and restrict conduction of heat on the heat absorbing plate 104 to the heat radiating plate 111 through the support column 401, 402 thus preventing against thermal loss.

Figure 7:
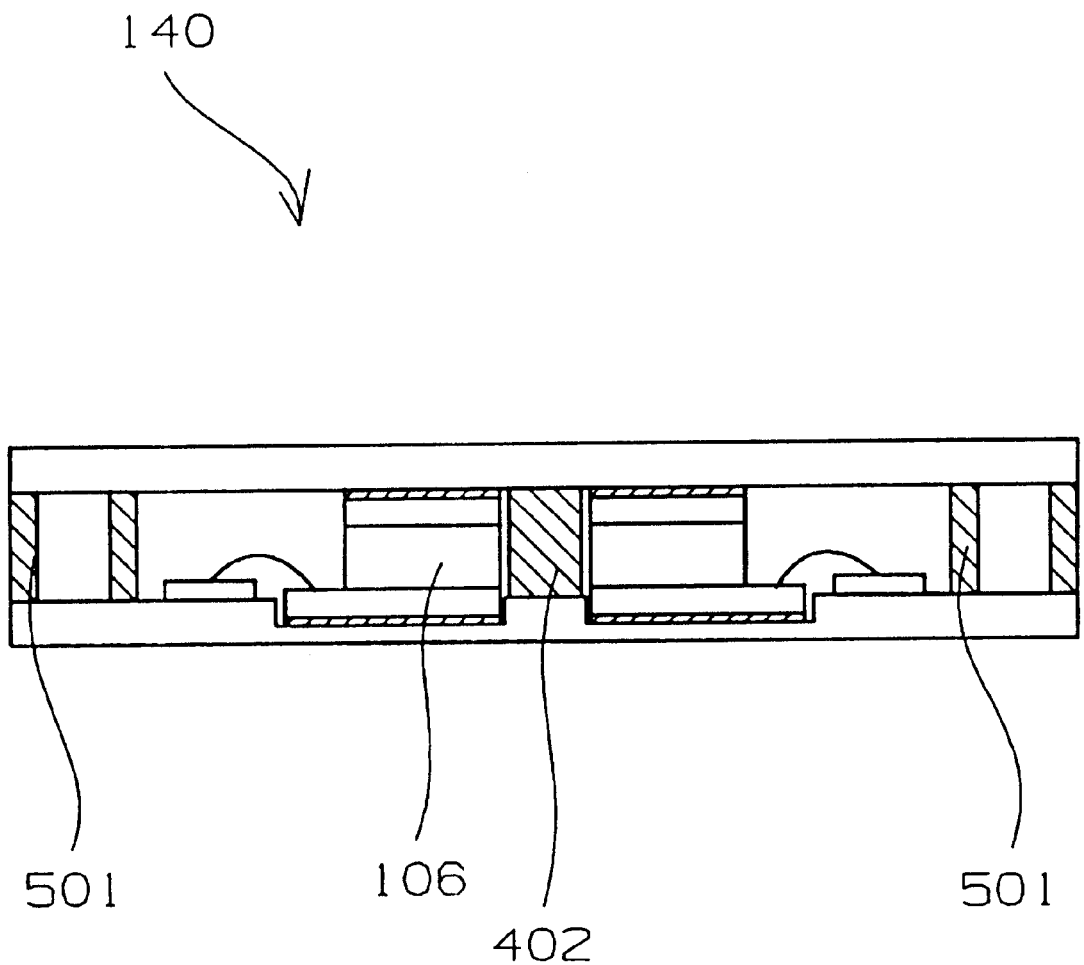
FIG. 7 is a plan view of a thermoelectric power generator unit of a third embodiment of the invention.

FIG. 7 is a sectional view of a thermoelectric power generator unit 140 as a third embodiment of the invention. Support columns 501 for protecting the thermoelectric elements 106 are hollow pipes. This structure serves to secure a strength of the support columns 501 and further prevent against thermal loss.

Figure 8:
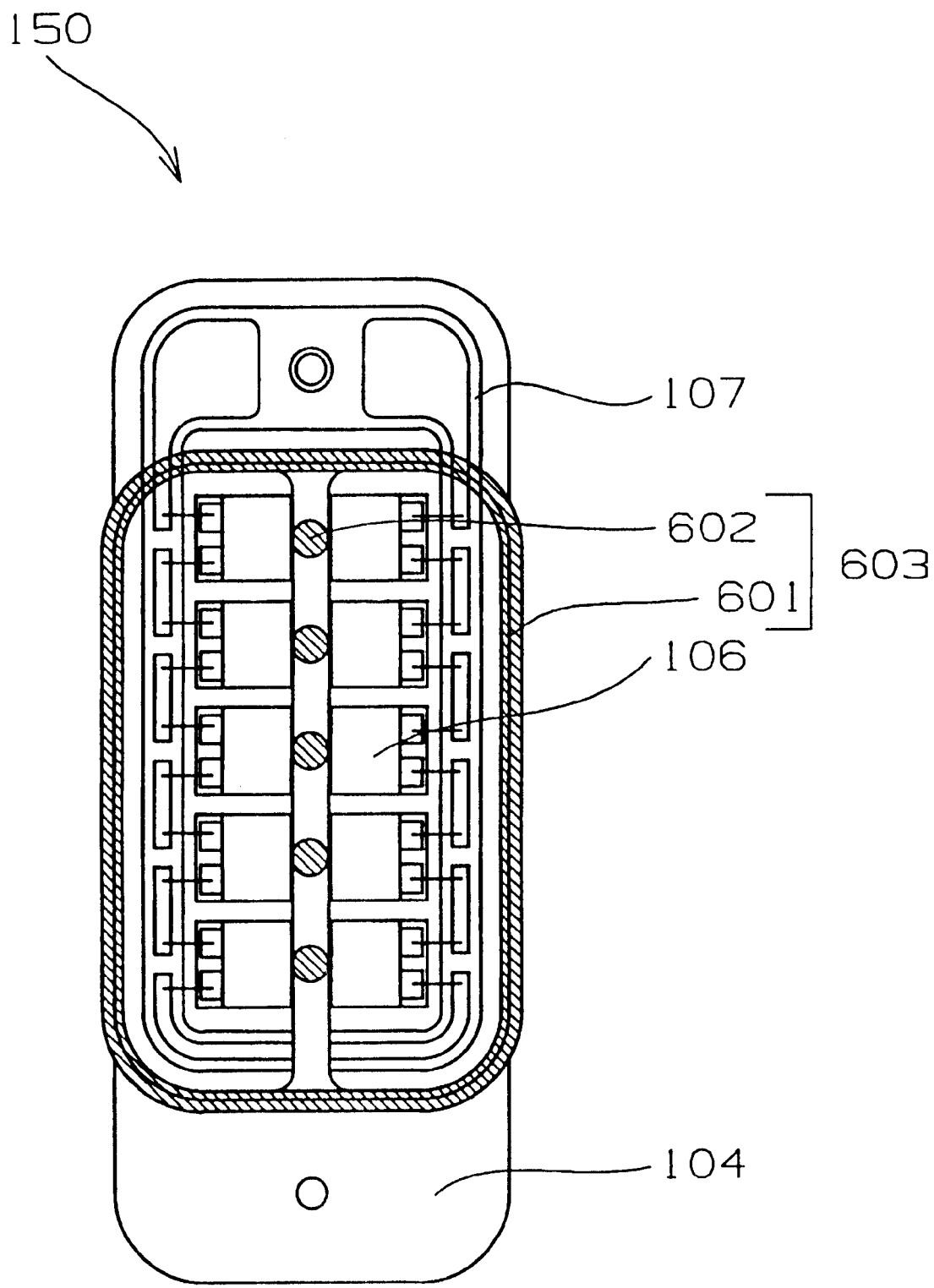
FIG. 8 is a plan view of a thermoelectric power generator unit of a fourth embodiment of the invention.

FIG. 8 is a plan view of a thermoelectric power generator unit 150 as a fourth embodiment of the invention. A frame 603 is adopted which is integrally formed with a frame 601 for protecting the thermoelectric elements 106 and support columns 602.

Figure 9:
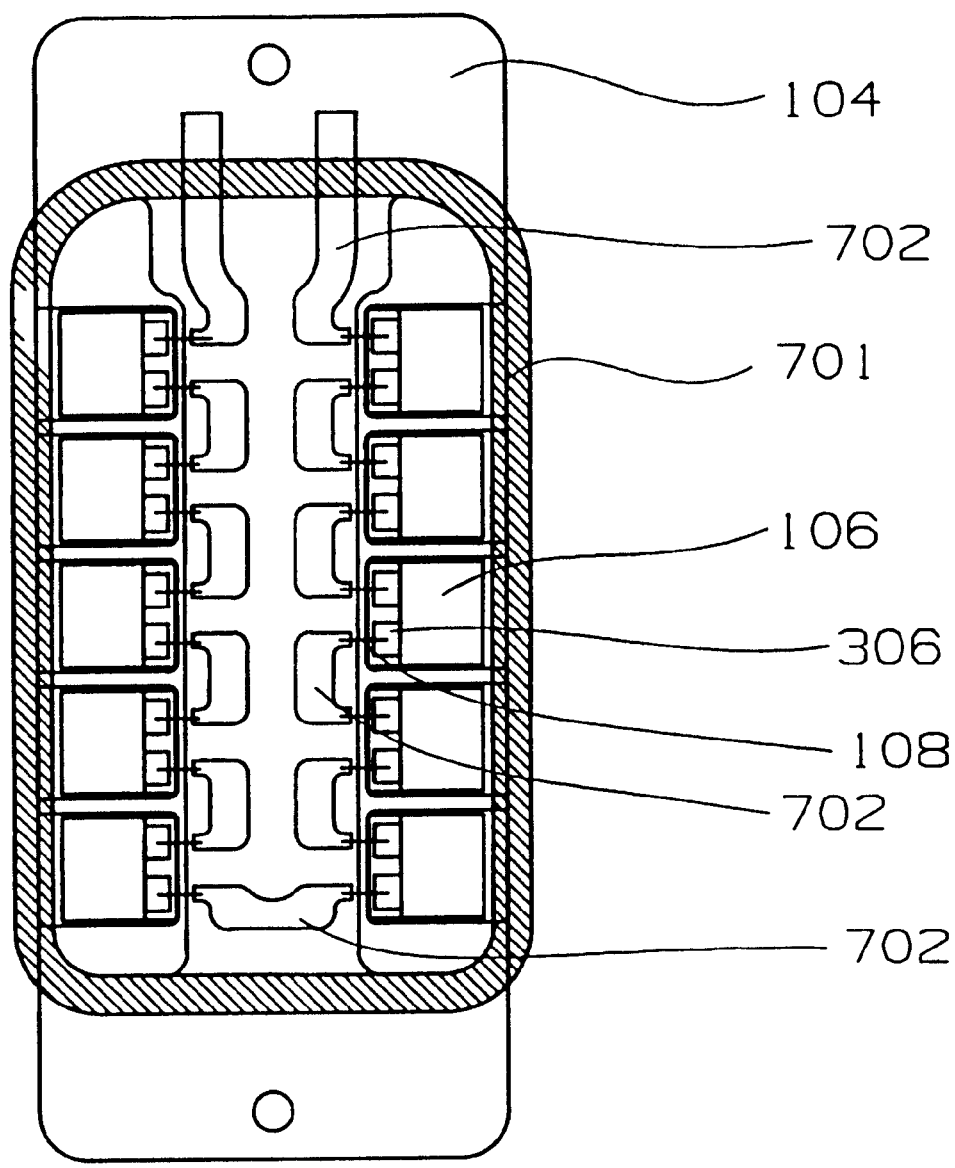
FIG. 9 is a plan view of a thermoelectric power generator unit of a fifth embodiment of the invention.
Figure 10:
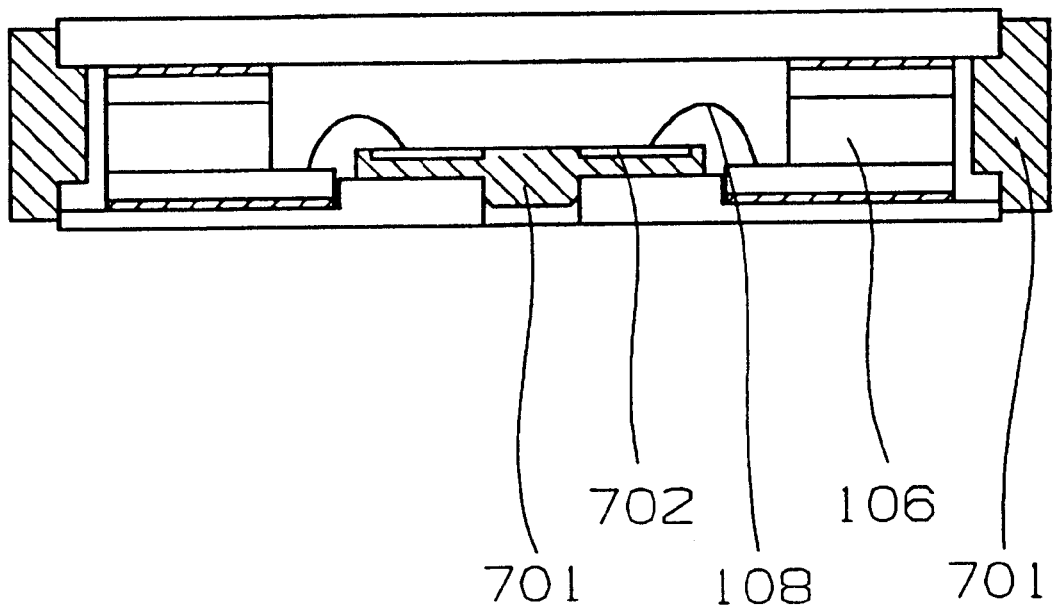
FIG. 10 is a plan view of the thermoelectric power generator unit of the fifth embodiment of the invention.

FIG. 9 is a plan view of a thermoelectric power generator unit 160 as a fifth embodiment of the invention, while FIG. 10 is a sectional view thereof. Insert forming is done to integrally form a frame 701 for protecting the thermoelectric elements 106 and a metal lead frame 702 for connecting the thermoelectric elements 106 in series. Through wires 108, connections are structurally made between output terminals 306 of the thermoelectric elements 106 and the lead frame 702.

Figure 11:
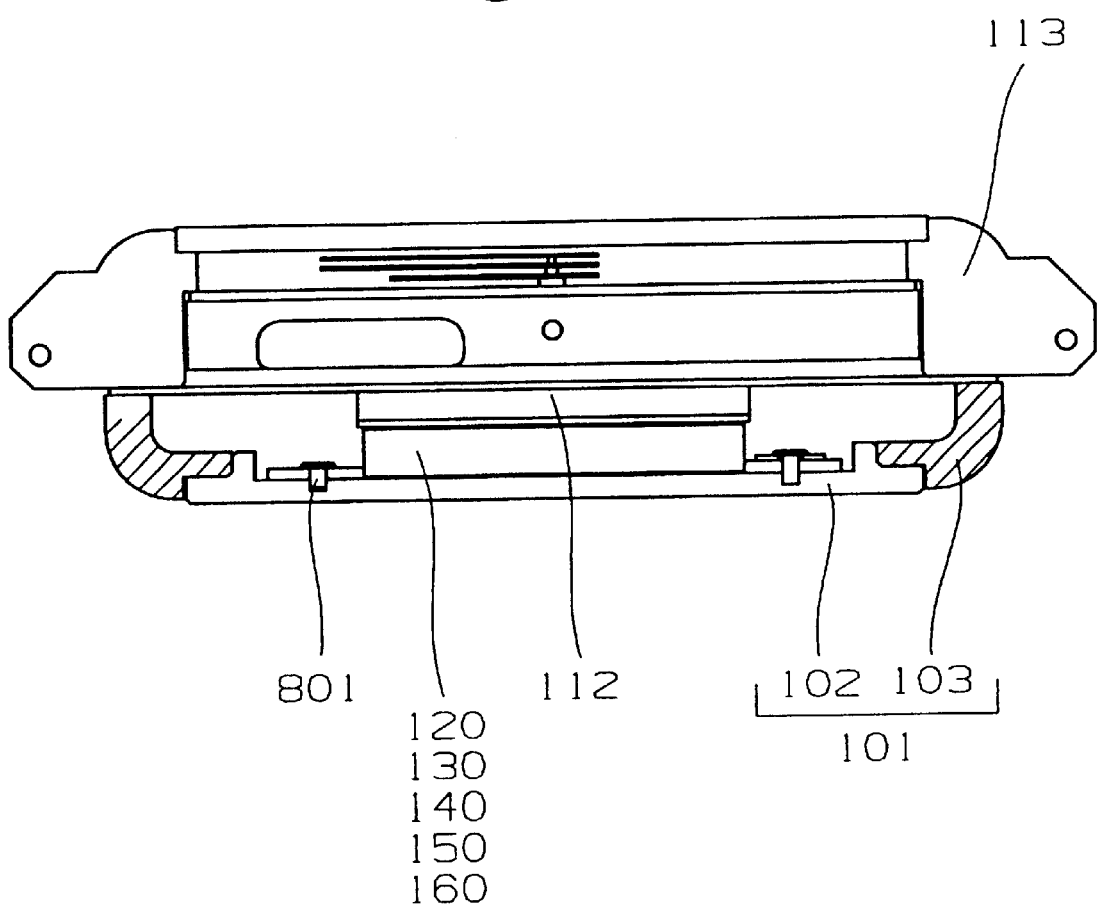
FIG. 11 is a sectional view showing a structure of a thermoelectric power generated timepiece of a first embodiment fixed with a thermoelectric power generator unit of the invention.

FIG. 11 is a sectional view showing a structure of a thermoelectric generation timepiece as a first embodiment to fix a thermoelectric generator unit of the invention. The thermoelectric power generator unit 120, 130, 140, 150, 160 is to be structurally fixed on a back lid member 102 by a fixing screw 801.

Figure 12:
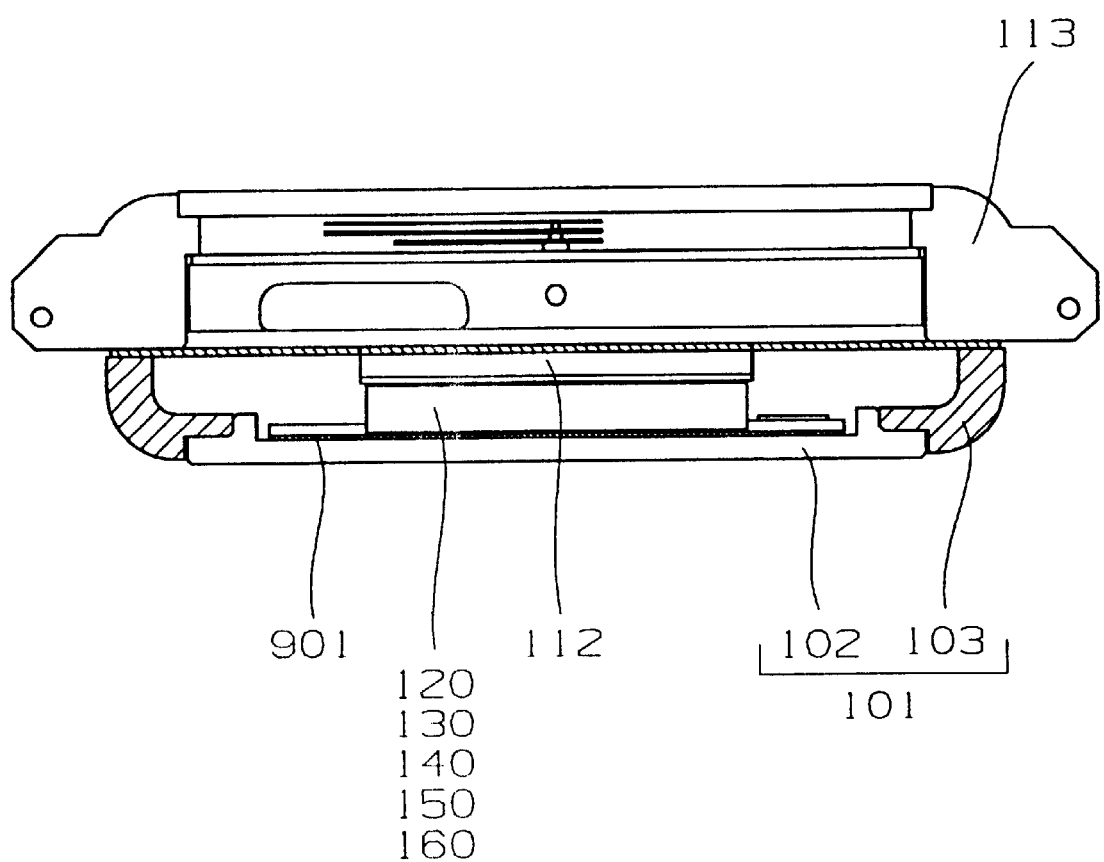
FIG. 12 is a sectional view showing a structure of a thermoelectric power generated timepiece of a second embodiment fixed with a thermoelectric power generator unit of the invention.

FIG. 12 is a sectional view showing a structure of a thermoelectric generation timepiece as a second embodiment to fix a thermoelectric generator unit of the invention. The thermoelectric power generator unit 120, 130, 140, 150, 160 is to be structurally fixed on a back lid member 102 by a thermally conductive adhesive 901.

Figure 13:
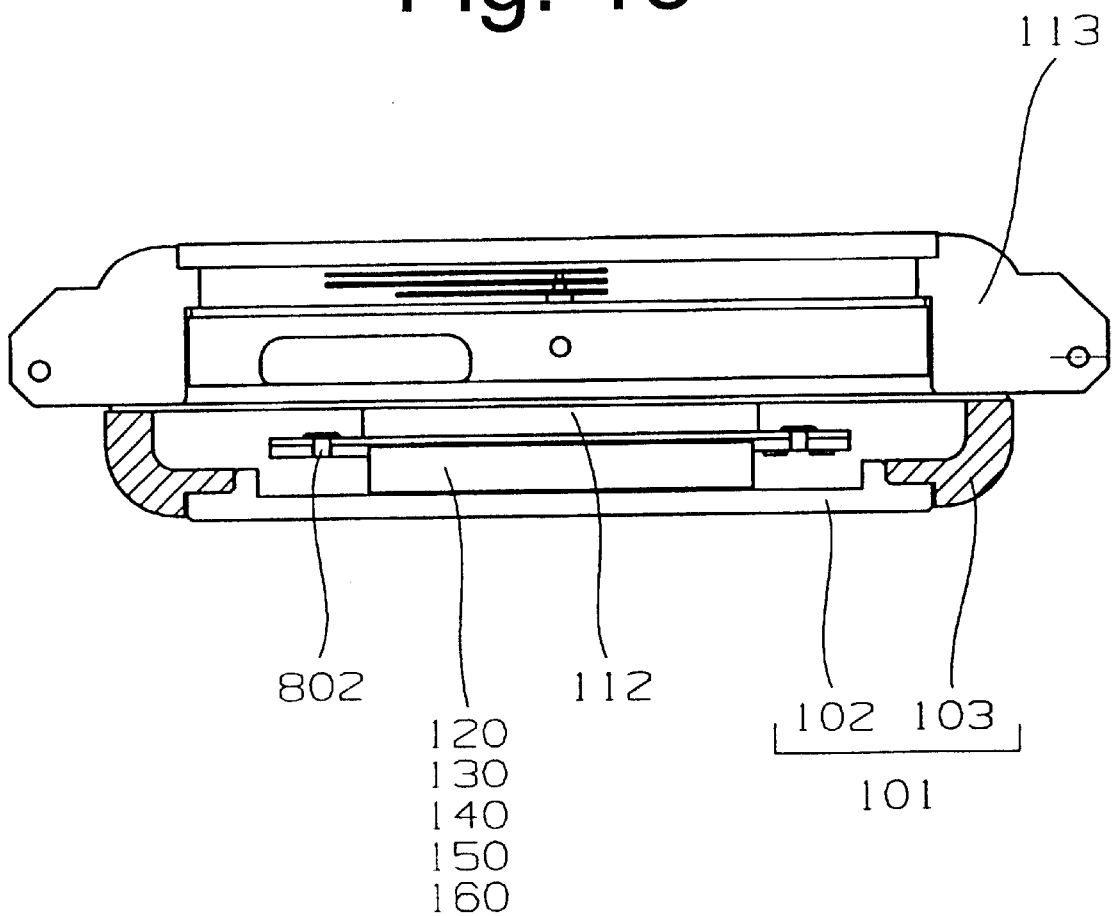
FIG. 13 is a sectional view showing a structure of a thermoelectric power generated timepiece of a third embodiment fixed with a thermoelectric power generator unit of the invention.

FIG. 13 is a sectional view showing a structure of a thermoelectric generation timepiece as a third embodiment to fix a thermoelectric generator unit of the invention. The thermoelectric power generator unit 120, 130, 140, 150, 160 is to be structurally fixed on the heat conducting plate 112 by a fixing screw 802.

Figure 14:
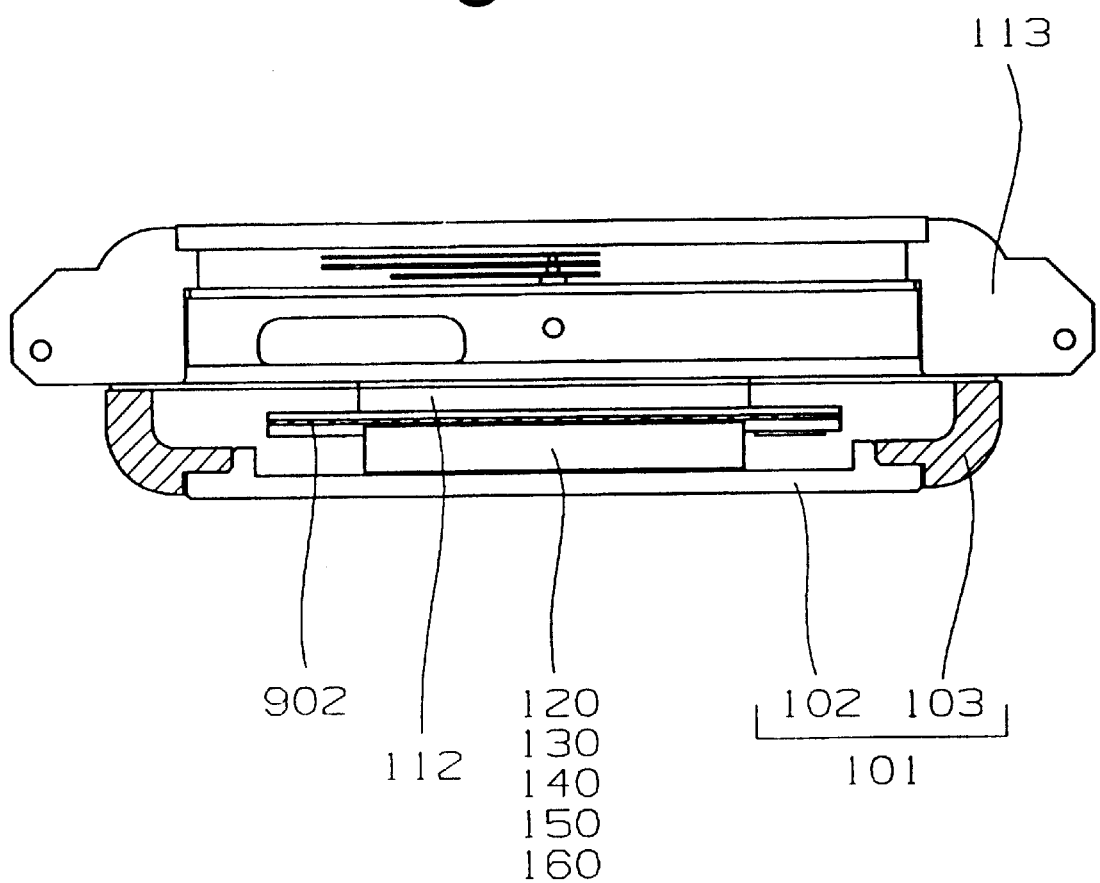
FIG. 14 is a sectional view showing a structure of a thermoelectric power generated timepiece of a fourth embodiment fixed with a thermoelectric power generator unit of the invention.

FIG. 14 is a sectional view showing a structure of a thermoelectric generation timepiece as a fourth embodiment to fix a thermoelectric generator unit of the invention. The thermoelectric power generator unit 120, 130, 140, 150, 160 is to be structurally fixed on the heat conducting plate 112 by a heat conductive adhesive 902.

Figure 15:
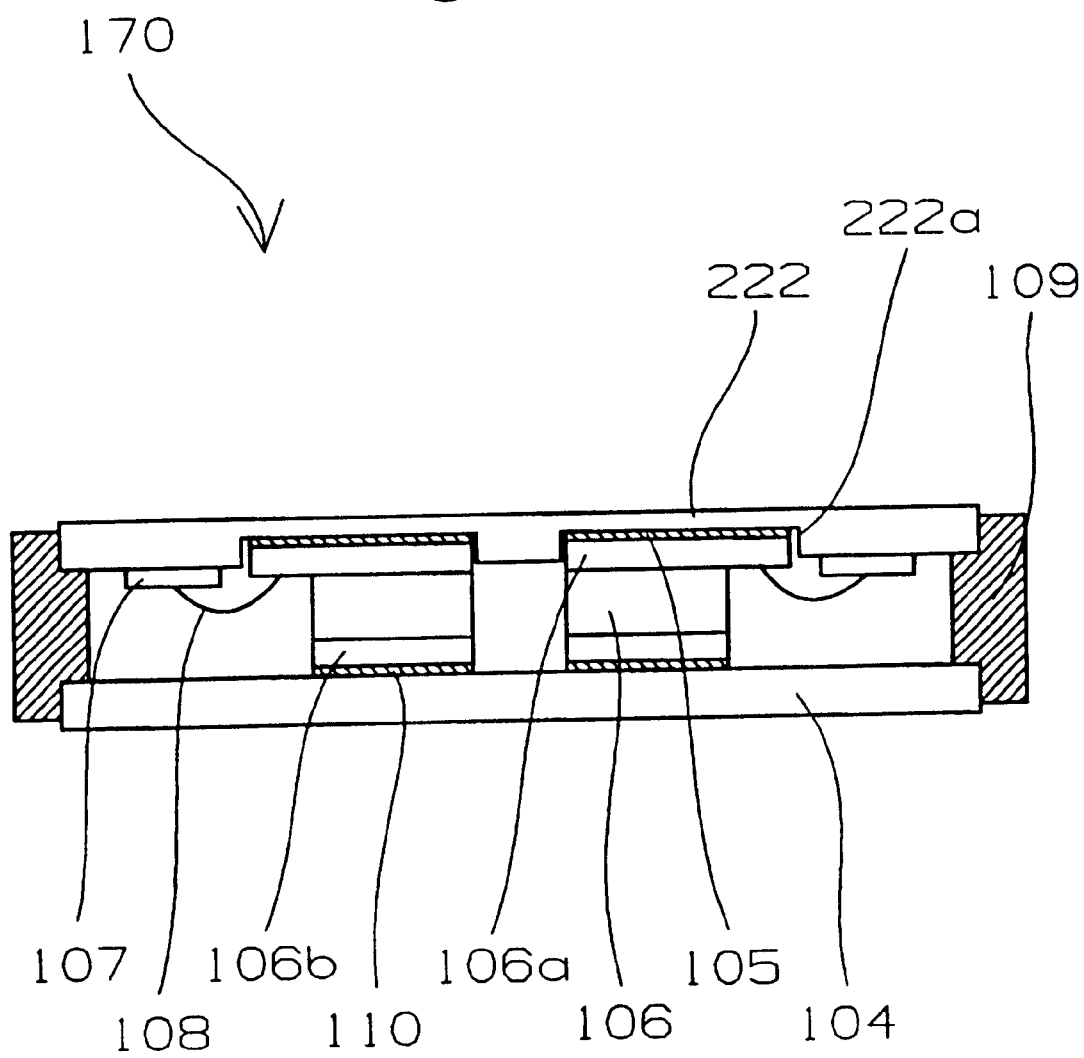
FIG. 15 is a sectional view of a thermoelectric power generator unit of a sixth embodiment of the invention.

FIG. 15 is a sectional view of a thermoelectric power generator unit 170 as a sixth embodiment of the invention. The thermoelectric power generator unit 170 has thermoelectric elements 106 placed on a heat radiating plate 222 through guided into grooves 222a and fixed by a heat conductive resin 105. Electrical connection is made between output terminals 306 (see FIG. 4) of the thermoelectric elements 106, chip boards 107 and wires 108. A frame 109 as protection means for the thermoelectric elements 106 is fixed on one side with a heat absorbing plate 104 and on the other side with a heat radiating plate 222.

INDUSTRIAL APPLICABILITY

The present invention is carried out in the forms as explained above and has the following effects.

The thermoelectric elements are protected by a frame having a heat absorbing plate or heat radiating plate or a heat absorbing plate or heat radiating plate having columns, thereby preventing the thermoelectric elements from being damaged due to an impact or excessive load and increasing a contact force on a heat conducting plate. Thus, the heat conducting efficiency can be improved and power generating performance can be improved.

Also, because the thermoelectric elements can be structured by required electromotive force, manufacturing is possible in a size corresponding to product size and facilitating handling during assembling and exchange.

What is claimed is:

1. A thermoelectric power generator unit comprising: a heat absorbing member for absorbing heat; a heat radiating member for radiating heat; one or more thermoelectric elements arranged between the heat absorbing member and the heat radiating member; holding means for fixedly holding the thermoelectric elements to at least one of the heat absorbing member and the heat radiating member; protecting means for protecting the thermoelectric elements and being disposed between the heat absorbing member and the heat radiating member; and electrical connecting means for connecting the thermoelectric elements in series; wherein the thermoelectric elements extend from one of the heat absorbing member and the heat radiating member by a first maximum height, and the protecting means extends from the one of the heat absorbing member and the heat radiating member by a second height larger than the first height so that a surface of the protecting means adjacent to the thermoelectric elements is higher than a top surface of the thermoelectric elements.

2. A thermoelectric power generator unit according to claim 1; wherein at least one of the heat absorbing member and the heat radiating member is formed of a material high in heat conductivity.

3. A thermoelectric power generator unit according to claim 1 or 2; wherein at least one of the heat absorbing member and the heat radiating member is formed of copper.

4. A thermoelectric power generator according to claim 1 or 2; wherein at least one of the heat absorbing member and the heat radiating member is formed of aluminum.

5. A thermoelectric power generator unit according to claim 1; further comprising positioning means for positioning the thermoelectric elements on at least one of the heat absorbing member and the heat radiating member.

6. A thermoelectric power generator unit according to claim 5; wherein the positioning means comprises grooves formed in at least one of the heat absorbing member and the heat radiating member for positioning the thermoelectric elements.

7. A thermoelectric power generator unit according to claim 1; wherein the holding means comprises an adhesive having a thermal conductivity.

8. A thermoelectric power generator unit according to claim 1; wherein the protecting means for protecting the thermoelectric elements is formed of a material low in thermal conductivity.

9. A thermoelectric power generator unit according to claim 8; wherein the material low in thermal conductivity is a resin.

10. A thermoelectric power generator unit according to claim 1, 8 or 9; wherein the protecting means for protecting the thermoelectric elements comprises a frame surrounding the thermoelectric elements.

11. A thermoelectric power generator unit according to claim 1, 8 or 9; wherein the protecting means for protecting the thermoelectric elements comprises at least one support column disposed in the vicinity of the thermoelectric elements.

12. A thermoelectric power generator unit according to claim 11; wherein the support comprises a hollow pipe.

13. A thermoelectric power generator unit according to claim 1, 8 or 9; wherein the protecting means for protecting the thermoelectric elements comprises a frame surrounding the thermoelectric elements and at least one support column disposed around or in between the thermoelectric elements.

14. A thermoelectric power generator unit according to claim 13; wherein the support column comprises a hollow pipe.

15. A thermoelectric power generator unit according to claim 1; further comprising a buffer member having thermal conductivity filled between the thermoelectric elements and at least one of the heat absorbing member and the heat radiating member.

16. A thermoelectric power generator unit according to claim 1; wherein the electrical connecting means for connecting the thermoelectric elements in series comprises chip boards and wires.

17. A thermoelectric power generator unit according to claim 1; wherein the electrical connecting means for connecting the thermoelectric elements in series comprises a metal lead frame and wires.

18. A thermoelectric power generator unit according to claim 17, wherein the metal lead frame is disposed on the protecting means.

19. A portable electronic appliance driven by a power generator unit, comprising: a barrel having opposed open sides; a rear portion covering one open side of the barrel and having a frame portion formed of a heat insulating member and a lid portion formed of a heat conductive material, the frame portion being disposed between the barrel and the lid portion to insulate the lid portion from the barrel; heat conducting means in contact with and held by the barrel; and a movement provided at an inner peripheral part of the barrel; wherein the power generator unit comprises the thermoelectric power generator unit according to claim 1, the heat absorbing member of the thermoelectric power generator unit is in contact with the lid portion, and the heat radiating member of the thermoelectric power generator unit is in contact with the heat conducting means.

20. A portable electronic appliance according to claim 19; further comprising fixing means for fixing the thermoelectric power generator unit to the lid portion.

21. A portable electronic appliance according to claim 19; further comprising fixing means for fixing the thermoelectric power generator unit to the heat conducting means.

22. A thermoelectric power generator unit according to claim 20 or 21, wherein the fixing means comprises a screw.

23. A thermoelectric power generator unit according to claim 20 or 21, wherein the fixing means comprises an adhesive having thermal conductivity.

24. A thermoelectric power generator unit having a unitary structure for generating power based on a temperature difference thereacross, comprising: a heat absorbing member and a heat radiating member both formed of thermally conductive material; a plurality of thermoelectric elements connected in series and disposed between the heat absorbing member and the heat radiating member, the thermoelectric elements being fixed to at least one of the heat absorbing member and the heat radiating member; and a protective frame and hollow support pipe disposed between the heat absorbing member and the heat radiating member to enhance rigidity.

25. A thermoelectric power generator unit according to claim 24; wherein at least one of the heat absorbing member and the heat radiating member has grooves formed therein for positioning the thermoelectric elements therein.

26. A thermoelectric power generator unit according to claim 24; wherein the protective frame is fixed to the heat absorbing member and the heat radiating member and surrounds an outer periphery of the thermoelectric elements.

27. A thermoelectric power generator unit according to claim 24; wherein the thermoelectric elements extend from one of the heat absorbing member and the heat radiating member by a first maximum height, and the protective frame extends from the one of the heat absorbing member and the heat radiating member by a second height larger than the first height so that a surface of the protective frame adjacent to the thermoelectric elements is higher than a top surface of the thermoelectric elements.

28. A portable electronic appliance driven by a power generator unit, comprising: a barrel having opposed sides; a rear portion covering one side of the barrel and having a frame portion formed of a heat insulating member and a lid portion formed of a heat conductive material, the frame portion being disposed between the barrel and the lid portion to insulate the lid portion from the barrel; heat conducting means in contact with and held by the barrel; and a movement provided at an inner peripheral part of the barrel; wherein the power generator unit comprises the thermoelectric power generator unit according to claim 24, the heat absorbing member of the thermoelectric power generator unit is in contact with the lid portion, and the heat radiating member of the thermoelectric power generator unit is in contact with the heat conducting means.

29. A thermoelectric power generator unit comprising: a heat absorbing member for absorbing heat; a heat radiating member for radiating heat; one or more thermoelectric elements arranged between the heat absorbing member and the heat radiating member; holding means for fixedly holding the thermoelectric elements to at least one of the heat absorbing member and the heat radiating member; at least one support column comprised of a hollow pipe disposed in the vicinity of the thermoelectric elements between the heat absorbing member and the heat radiating member for protecting the thermoelectric elements; and electrical connecting means for connecting the thermoelectric elements in series.

30. A portable electronic appliance driven by a power generator unit, comprising: a barrel having opposed open sides; a rear portion covering one open side of the barrel and having a frame portion formed of a heat insulating member and a lid portion formed of a heat conductive material, the frame portion being disposed between the barrel and the lid portion to insulate the lid portion from the barrel; heat conducting means in contact with and held by the barrel; and a movement provided at an inner peripheral part of the barrel; wherein the power generator unit comprises the thermoelectric power generator unit according to claim 29, the heat absorbing member of the thermoelectric power generator unit is in contact with the lid portion, and the heat radiating member of the thermoelectric power generator unit is in contact with the heat conducting means.

31. A portable electronic appliance according to claim 30; further comprising fixing means for fixing the thermoelectric power generator unit to the lid portion.

32. A thermoelectric power generator unit according to claim 31, wherein the fixing means comprises a screw.

33. A thermoelectric power generator unit according to claim 32; wherein the fixing means comprises an adhesive having thermal conductivity.

34. A thermoelectric power generator unit according to claim 32; wherein the thermoelectric elements extend from one of the heat absorbing member and the heat radiating member by a first maximum height, and the protective frame extends from the one of the heat absorbing member and the heat radiating member by a second height larger than the first height so that a surface of the protective frame adjacent to the thermoelectric elements is higher than a top surface of the thermoelectric elements.

35. A thermoelectric power generator unit according to claim 33; wherein the electrical connecting means for connecting the thermoelectric elements in series comprises a metal lead frame and wires.

36. A thermoelectric power generator unit according to claim 35; wherein the metal lead frame is disposed on the protective frame.

37. A portable electronic appliance according to claim 33; further comprising fixing means for fixing the thermoelectric power generator unit to the heat conducting means.

38. A thermoelectric power generator unit according to claim 29; wherein at least one of the heat absorbing member and the heat radiating member is formed of a material high in heat conductivity.

39. A thermoelectric power generator unit according to claim 29; wherein at least one of the heat absorbing member and the heat radiating member is formed of copper.

40. A thermoelectric power generator according to claim 29; wherein at least one of the heat absorbing member and the heat radiating member is formed of aluminum.

41. A thermoelectric power generator unit according to claim 29; further comprising positioning means for positioning the thermoelectric elements on at least one of the heat absorbing member and the heat radiating member.

42. A thermoelectric power generator unit according to claim 41; wherein the positioning means comprises grooves formed in at least one of the heat absorbing member and the heat radiating member for positioning the thermoelectric elements.

43. A thermoelectric power generator unit according to claim 29; wherein the holding means comprises an adhesive having thermal conductivity.

44. A thermoelectric power generator unit according to claim 29; wherein the at least one support column is formed of a material low in thermal conductivity.

45. A thermoelectric power generator unit according to claim 39; wherein the material low in thermal conductivity is a resin.

46. A thermoelectric power generator unit according to claim 29; further comprising a protective frame surrounding the thermoelectric elements and the at least one support column.

47. A thermoelectric power generator unit according to claim 29; further comprising a buffer member having thermal conductivity filled between the thermoelectric elements and the one of the heat absorbing member and the heat radiating member.

48. A thermoelectric power generator unit according to claim 29; wherein the electrical connecting means for connecting the thermoelectric elements in series comprises chip boards and wires.

\* \* \* \* \*